(12) United States Patent
Delaunay et al.

(10) Patent No.: US 7,338,554 B2
(45) Date of Patent: Mar. 4, 2008

(54) METHOD OF SYNTHESISING AND GROWING NANORODS FROM A METAL CARBIDE ON A SUBSTRATE, SUBSTRATES THUS OBTAINED AND APPLICATIONS THEREOF

(75) Inventors: Marc Delaunay, Meylan (FR); Francoise Vinet, Grenoble (FR)

(73) Assignee: Commissariat a L'Energie Atomique, Paris (FR)

( * ) Notice: Subject to any disclaimer, the term of this patent is extended or adjusted under 35 U.S.C. 154(b) by 327 days.

(21) Appl. No.: 10/532,500

(22) PCT Filed: Dec. 4, 2003

(86) PCT No.: PCT/FR03/50154

§ 371 (c)(1),
(2), (4) Date: Apr. 25, 2005

(87) PCT Pub. No.: WO2004/055232

PCT Pub. Date: Jul. 1, 2004

(65) Prior Publication Data

US 2005/0271815 A1    Dec. 8, 2005

(30) Foreign Application Priority Data

Dec. 9, 2002    (FR)    .................................. 02 15530

(51) Int. Cl.
*C30B 1/02*    (2006.01)
(52) U.S. Cl. .................... 117/3; 117/4; 117/86; 117/94; 117/95
(58) Field of Classification Search .................... 117/3, 117/4, 86, 94, 95
See application file for complete search history.

(56) References Cited

U.S. PATENT DOCUMENTS 6,346,303 B1    2/2002    Shih et al.

(Continued)

FOREIGN PATENT DOCUMENTS

EP    1 129 990    9/2001

(Continued)

OTHER PUBLICATIONS

Young, Joon Yoon et al.: "Growth control of single and multi-walled carbon nanotubes by thin film catalyst", Chemical Physics Letters, vol. 366, No. 1-2, pp. 109-114, Nov. 25, 2002. XP-002255586.

(Continued)

*Primary Examiner*—Robert Kunemund
(74) *Attorney, Agent, or Firm*—Oblon, Spivak, McClelland, Maier & Neustadt, P.C.

(57) ABSTRACT

The invention relates to a process for synthesizing nanorods of a carbide of one metal M1 on a substrate, which comprises:
a) the deposition, on the substrate, of a layer of nanocrystals of oxide of the metal M1 and nanocrystals of oxide of at least one metal M2 different from metal M1, the M1 metal oxide nanocrystals being dispersed within this layer;
b) the reduction of the M1 and M2 metal oxide nanocrystals into corresponding metal nanocrystals; and
c) the selective growth of the M1 metal nanocrystals.

The invention also relates to a process for growing nanorods of a carbide of one metal M1 on a substrate from nanocrystals of this metal, to the substrates thus obtained and to their applications: fabrication of Microsystems provided with chemical or biological functionalities, in particular the fabrication of biosensors; electron emission sources, for example for flat television or computer screens; etc.

25 Claims, 6 Drawing Sheets

U.S. PATENT DOCUMENTS 6,841,508 B2 *   1/2005   Moy et al. .................. 502/174

FOREIGN PATENT DOCUMENTS

FR            98 00777         7/1999

OTHER PUBLICATIONS

Chen, X. H. et al.: "The formation conditions of carbon nanotubes array based on FeNi alloy island films", Thin Solid Films, vol. 339, No. 1-2, pp. 6-9, Feb. 8, 1999. XP-002255587.

Young, Chul Choi et al.: "Low temperature synthesis of carbon nanotubes by microwave plasma-enhanced chemical vapor deposition", Synthetic Metals, vol. 108, pp. 159-163, 2000. XP-000957661.

Lin, P. H. et al.: "Low Teomperature Growth of Aligned Carbon Nanotubes in Large Area", International Journal of Modern Physics B, vol. 16, No. 6 & 7, pp. 853-859, Mar. 20, 2002. XP009017872.

Flahaut, E.: "Synthesis of single-walled carbon nanotube-Co-MgO composite powders and extraction of the nanotubes", J. Mater. Chem., vol. 10, pp. 249-252, 2000.

Zhu, Y. Q.: "Morphology, structure and growth of WS2 nanotubes", J. Mater. Chem., vol. 10, pp. 2570-2577, 2000.

Bower, Chris et al.: "Plasma-induced alignment of carbon nanotubes", Applied Physics Letters, vol. 77, No. 6, pp. 830-832, Aug. 7, 2000.

Zhang, W.D.: "Growth of vertically aligned carbon-nanotube array on large area of quartz plates by chemical vapor deposition", Appl. Phys. A, vol. 74, pp. 419-422, 2002.

Hadobas, K. et al.: "Reflection properties of nanostructure-arrayed silicon surfaces", Nanotechnology, vol. 11, pp. 161-164, 2000.

Ren, Z. F. et al.: "Growth of a single freestanding multiwall carbon nanotube on each nanonickel dot", Applied Physics Letters, vol. 75, No. 8, pp. 1086-1088, Aug. 23, 1999.

Teo, K. B. K. et al.: "Uniform patterned growth of carbon nanotubes without surface carbon", Applied Physics Letters, vol. 79, No. 10, pp. 1534-1536, Sep. 3, 2001.

Fan, Shoushan et al.: "Carbon nanotube arrays on silicon substrates and their possible application", Physica E, vol. 8, pp. 179-183, 2000.

Chhowalla, M. et al.: "Growth process conditions of vertically aligned carbon nanotubes using plasma enhanced chemical vapor deposition", Journal of Applied Physics, vol. 90, No. 10, pp. 5308-5317, Nov. 15, 2001.

Li, J. et al.: "Highly-ordered carbon nanotube arrays for electronics applications", Applied Physics Letters, vol. 75, No. 3, pp. 367-369, Jul. 19, 1999.

Delaunay, M.: "Electron cyclotron resonance plasma ion source for material depositions", Review of Scientific Instruments, vol. 69, No. 6, pp. 2320-2324, Jun. 1998.

* cited by examiner

METHOD OF SYNTHESISING AND GROWING NANORODS FROM A METAL CARBIDE ON A SUBSTRATE, SUBSTRATES THUS OBTAINED AND APPLICATIONS THEREOF

TECHNICAL FIELD

The invention relates to a process for synthesizing metal carbide nanorods on a substrate, and more particularly chromium carbide nanorods, and to a process for growing such nanorods on a substrate from nanocrystals of the same metal.

It furthermore relates to the substrates thus obtained and to their applications.

The synthesis and growth processes according to the invention result in the formation of metal carbide nanorods which, apart from having a rigid and robust structure inherent in carbides, are firmly attached to the substrate on which their synthesis or their growth was carried out, perpendicular to the principal plane of this substrate, and are physically separate from one another, i.e. are not in contact with one another.

These nanorods are therefore capable of being functionalized by the grafting of organic, chemical or biological molecules and consequently are of most particular benefit for the fabrication of microsystems provided with chemical or biological functionalities, and more particularly the fabrication of useful biosensors, for example in the fields of medical research and analysis in clinical biology and agri-foodstuffs, especially for the control of manufacturing processes and quality control of raw materials and of end products, or else in the environmental field.

The nanorods are also capable of acting as field emission tips for electron emission and thus of forming part of the construction of electron emission sources, for example for the fabrication of flat television or computer screens, or of being used to modify the optical properties of surfaces, such as for example luminescence with low wavelength dispersion.

They may also find applications in the production of useful nanofluid devices, for example in chromatography techniques.

PRIOR ART

In recent years, many processes for obtaining nanotubes, mainly carbon nanotubes, or nanorods have been proposed.

Table I, which is at the end of the present description, gives representative examples of these processes, which are essentially of three types.

First, there are those which are aimed at producing nanotubes on powders of catalyst crystals and which result in the formation of nanotubes that are not attached to any substrate.

Thus, document [1] (Flahaut et al., *J. Mater. Chem.*, 2000, 10, 249-252) describes a process for the preparation of carbon nanotubes, which consists in reducing an $Mg_{0.9}Co_{0.1}O$ solid solution, by an $H_2CH_4$ mixture in a furnace heated to 1000° C., in order to obtain a composite powder formed from carbon nanotubes, from cobalt and from magnesium oxide, and then in treating this powder with an acid in order to remove the cobalt catalyst.

Similarly, document [2] (Zhu et al., *J. Mater. Chem.*, 2000, 10, 2570-2577) discloses a process for the preparation of tungsten disulphide nanotubes, in which a powder composed of tungsten oxide nanorods or nanoneedles is reduced by hydrogen sulphide in a furnace heated to 1100° C., and then the nanotubes thus formed are separated from one another by subjecting the powder to ultrasound in an acetone bath.

Secondly, there are processes which aim to produce, on a substrate, an adherent film formed from nanotubes that are vertically erect but touching one another.

Thus, document [3] (Bower et al., Appl. Phys. Lett., 2000, 77(6), 830-832) relates to a process for obtaining a uniform film of carbon nanotubes on a silicon substrate, which process involves the deposition of carbon using MPECVD (Microwave Plasma Enhanced Chemical Vapour Deposition), by decomposition of the acetylene present in a $C_2H_2/NH_3$ mixture. The silicon substrate is precoated with a layer of cobalt about 2 nm in thickness, this layer being intended to act as a catalytic seed for growing the nanotubes.

The authors of document [4] (Zhang et al., Appl. Phys. A, 2002, 74 419-422) have also obtained a uniform film of carbon nanotubes on a quartz substrate, but by CVD and using ethylene diamine as carbon precursor. Here again, thermal deposition of a nickel film, capable of acting as a catalytic seed, is produced beforehand on the substrate.

The third type of process groups together those employing a lithography operation for the purpose of obtaining, on a substrate, nano-objects that are both vertically erect and separated from one another.

Thus, document [5] (Hadobas et al., Nanotechnology, 2000, 11, 161-164) relates to a process for obtaining a grid pattern of silicon nantostructures on a substrate composed of this same material, which process comprises the formation of a pattern by optical lithography by means of an argon laser, followed by oxygen plasma etching and then sulphur hexafluoride plasma etching. The nanostructures thus obtained measure 35 to 190 nm in height, depending on the specimens, and are separated from one another by 300 nm.

Document [6] (Ren et al., Appl. Phys. Lett., 1999, 75(8), 1086-1088) describes a process for the production of carbon nanotubes on a silicon substrate, which consists in producing, on this predoped substrate, a nickel grid pattern by electron beam lithography followed by electron beam evaporation, and then by depositing carbon by PEHFCVD (Plasma Enhanced Hot Filament Chemical Vapour Deposition) using an acetylene/ammonia mixture, the nickel tips acting as seeds for the growth of the nanotubes.

Document [7] (Teo et al., Appl. Phys. Lett., 2001, 79(10), 1534-1536) presents a process that relies on the same principle, but in which the nickel pattern is produced by two successive lithographic steps, one involving optical lithography and the other electron beam lithography, while the carbon deposition is obtained by DCCVD (Direct Current Chemical Vapour Deposition) from an acetylene/ammonia mixture.

Document [8] (Fan et al., Physica E, 2000, 8, 179-183) proposes a process for obtaining bundles of carbon nanotubes on a silicon substrate rendered porous beforehand, which process consists in depositing, on this substrate, an iron film provided with uniformly spaced quadrangular apertures, by lithography followed by electron beam evaporation, and then in causing the bundles of carbon nanotubes to grow by placing the substrate in a stream of ethylene in a furnace heated to 700° C.

Because the processes described in documents [5] to [8] include a lithography operation, which is extremely expensive and can be carried out only over limited areas, the use of these processes is inconceivable for the production of nano-objects of the nanotube or nanorod type over large areas. In addition, the dispersion of the nanotubes on the surface of the substrate proves to be highly irregular in the case of document [6], whereas it is non-existent in the case of document [8], because the latter case results in the formation of nanotubes joined together in bundles.

In document [9] (Chhowalla et al., J. Appl. Phys., 2001, 90(10), 5308-5317) it has also been proposed, in order to grow vertically aligned carbon nanotubes on a silicon substrate, to deposit, on this substrate, a thin film of a cobalt- or nickel-based catalyst by sputtering or thermal evaporation, then to sinter this catalyst film by heating to 750° C. and to deposit carbon by DCCVD using an acetylene/ammonia mixture.

Although this process has the advantage of not using lithography, it does not make it possible, however, to obtain a uniform distribution of the nanotubes and with a sufficient spacing between the latter.

Finally, document [10] (Li et al., Appl. Phys. Lett., 1999, 75(3), 367-369) teaches a process for the growth of carbon nanotubes by the pyrolysis of acetylene on cobalt predeposited in the channels of an alumina layer. However, the distance between these channels cannot be easily controlled and, here again, the nanotubes obtained are insufficiently far apart.

Thus, the only processes at the present time that allow the production, on a substrate, of vertically erect nano-objects separated from one another all include a lithography operation, which is both expensive and limited to small areas.

The inventors were therefore set the objective of providing a process for obtaining, on a substrate, metal carbide nanorods which are not only firmly attached to this substrate, perpendicular to its principal plane, but are physically separate from one another, this being achieved without recourse to any lithography operation, so that this process can be used for the production of nanorods over large areas and has a cost permitting it to be carried out on an industrial scale.

This and other objectives were achieved by the present invention, which proposes both a process for synthesizing metal carbide nanorods on a substrate and a process for growing such nanorods on a substrate from nanocrystals of the same metal.

SUMMARY OF THE INVENTION

The subject of the invention is firstly a process for synthesizing nanorods of a carbide of one metal M1 on a substrate, which comprises the following steps:
a) the deposition, on this substrate, of a layer formed of nanocrystals of oxide of the metal M1 and nanocrystals of oxide of at least one metal M2 different from M1, the M1 metal oxide nanocrystals being dispersed within this layer;
b) the reduction of the M1 and M2 metal oxide nanocrystals into corresponding metal nanocrystals; and
c) the selective growth of the M1 metal nanocrystals.

According to the invention, step a) is preferably carried out by reactive sputtering from a target consisting of the metals M1 and M2 by an oxygen plasma produced by an ECR (electron cyclotron resonance) microwave plasma source.

The reactive sputtering from a metal target by a plasma of a gas produced by an ECR microwave plasma source, as a technique for depositing a metal or a metal oxide on a substrate, is now well known. The principle of this technique and an installation for achieving high magnetic confinement allowing it to be implemented on substrates of large area, have been described by Delaunay and Touchais in Rev. Sci. Instrum., 1998, 69(6), 2320-2324 [11].

It will therefore simply be recalled that this technique consists in injecting microwave power (for example at a frequency of 2.45 GHz) into a plasma chamber consisting of one or more waveguides and including a region of electron cyclotron resonance (for example at 875 gauss when the frequency of the microwave power is 2.45 GHz), thereby causing dissociation of the gas that is introduced into the plasma chamber and is at low pressure, generally below $10^{-3}$ mbar.

The ions and electrons thus created diffuse along the magnetic field lines and bombard a negatively biased metal target. The sputtering of this target in turn generates metal atoms that are deposited on the substrate located facing the target, thus forming a metal or metal oxide layer on this substrate.

In the synthesis process according to the invention, sputtering of the metal target must result in the deposition, on the substrate, of a layer formed of nanocrystals of at least two different metal oxides. Specifically, this layer must comprise, on the one hand, nanocrystals made of oxide of the metal M1, that is to say the metal intended to form part of the composition of the metal carbide nanorods that it is desired to synthesize, and nanocrystals made of oxide of one or more metals M2 different from M1, the role of which is to ensure that the M1 metal oxide nanocrystals are dispersed within this layer, so that the latter are physically separate from one another.

This is why the metal target used during step a) consists of both the metal M1 and the metal or metals M2.

According to the invention, it is possible to adjust the flux of atoms of the metals M1 and M2 that are produced by the metal target when it is being sputtered and thus to control the density of the M1 metal oxide nanocrystals present in the layer of nanocrystals covering the substrate after step a), by varying the composition of this target and/or its bias.

Thus, in particular, the metal target may consist of a mixture of the metals M1 and M2, in which case it is subjected to one and the same negative bias voltage over its entire area.

The metals M1 and M2 are therefore present in this mixture in atomic proportions (i.e. expressed as the number of atoms) which:
either corresponds to those in which they are desired to be found in the layer of nanocrystals covering the substrate after step a), if it turns out that the rate of sputtering of said metals M1 and M2 are approximately the same under the chosen operating conditions;
or takes into account the differences that exist between the rates of sputtering of the metals M1 and M2, if it turns out that these rates are not the same under the chosen operating conditions.

As a variant, the metal target may comprise several zones, adjacent to one another or separated from one another, at least one of these zones then consisting of the metal M1, whereas the one or more other of these zones consist(s) of the metal or metals M2.

In this case, the flux of atoms of the metals M1 and M2 that are produced by the various zones of the metal target may be obtained:
either by varying the respective areas of these zones, in which case it is possible to apply the same negative bias voltage to them;
or by varying the negative bias voltages that are respectively applied to them, in which case the various zones may have the same area;
or else by varying both parameters, namely area and negative bias voltage.

Whatever the situation, the choice of these parameters must take into account any differences in sputtering rate that the metals M1 and M2 have depending on the operating conditions.

The reduction of the M1 and M2 metal oxide nanocrystals deposited on the substrate during step a) into corresponding metal nanocrystals—or step b) of the synthesis process according to the invention—is preferably carried out by a hydrogen plasma produced by an ECR microwave plasma source, the substrate then being heated.

Similarly, the selective growth of the M1 metal nanocrystals—or step c) of the synthesis process according to the invention—is preferably carried out by a plasma of at least one hydrocarbon produced by an ECR microwave plasma source, the substrate also being heated.

It is thus possible to carry out all the steps of the synthesis process according to the invention by means of one and the same device, namely an ECR microwave plasma source, this being a further advantage of the invention.

This ECR microwave plasma source is preferably a source with high magnetic confinement of the type described in document [11], allowing the generation of low-pressure plasmas with highly energetic electrons and thereby ensuring a very high degree of dissociation of the gases in the plasma chamber.

With regard to the foregoing, the metal M1 is preferably chosen from metals capable of reacting, in step c), with organic molecules or radicals that are in gaseous form in order to form, with them, a metal carbide and thus induce the growth of nanorods made of this carbide from the nanocrystals of this metal M1.

Metals of this type are especially chromium and molybdenum, chromium being preferred within the context of the invention.

The metal or metals M2 are chosen from metals having an affinity for carbon-containing molecules or radicals that are in gaseous form, which allows them, in step c) to fix these molecules or radicals by metal-carbon bonds and makes it possible to form a protective graphitic layer that blocks any growth from the nanocrystals of this or these metals M2.

Such metals are those known as catalysts in organic chemistry. They are in particular iron, nickel and cobalt, iron and nickel being preferred within the context of the invention.

When the metal M1 is chromium, while the metal or metals M2 are chosen from iron and nickel, then step a) is preferably carried out by reactive sputtering of a target made of a stainless steel composed of iron and chromium, or of iron, chromium and nickel, such as for example an austenitic stainless steel composed of 68% iron, 18% chromium and 14% nickel.

This target is advantageously biased with a negative voltage of −200 V or higher and preferably of between −400 and −200 V, while the oxygen plasma is maintained at a pressure of generally $10^{-3}$ mbar or below, and preferably between $10^{-4}$ and $10^{-3}$ mbar, so as to optimize the energy of the electrons produced by the plasma.

The other operating conditions, such as the frequency and the power of the electromagnetic wave delivered by the microwave generator, or the currents presented by the magnetic field at the point of injection of the microwave power and in the ECR zone, are similar to those generally used in high-confinement ECR microwave plasma sources, and are especially similar to those described by Delaunay and Touchais in document [11].

Thus, after reactively sputtering the target for a time of about 20 minutes, a layer of generally around 50 nm in thickness is obtained, which comprises chromium oxide nanocrystals disseminated between iron oxide nanocrystals and possibly nickel oxide nanocrystals, all these nanocrystals typically having a diameter of approximately 100 to 500 nm.

Preferably, in step b) the hydrogen plasma is maintained at a pressure of $10^{-2}$ mbar or below, and advantageously between $10^{-3}$ and $10^{-2}$ mbar, while the substrate is heated to a temperature ranging from 300 to 600° C. depending on the rate at which it is desired to reduce the metal oxide nanocrystals.

Under these conditions, the chromium oxide, iron oxide and possibly nickel oxide nanocrystals are reduced to chromium, iron and, as the case may be, nickel nanocrystals which typically measure around 5 to 100 nm in diameter, in the space of 5 to 20 minutes.

Moreover, in step c), it is preferred that the hydrocarbon plasma be maintained at a pressure of $10^{-2}$ mbar or below, and preferably between $10^{-3}$ and $10^{-2}$ mbar, and that the substrate be heated to a temperature of 600° C. or higher, and preferably between 600 and 800° C., in order to deliver the activation energy needed for the growth of the carbide nanorods.

According to the invention, the hydrocarbon or hydrocarbons used in step c) are chosen from alkanes, alkenes, and alkynes such as, for example, methane, ethane, propane, ethylene and acetylene, and mixtures thereof.

It is preferred to use ethylene.

Thus, a structure of the nail board type, formed of a substrate and chromium carbide rods of nanoscale diameter, i.e. typically around 5 to 100 nm, is obtained, these rods being firmly attached to the surface of this substrate, perpendicular to the principal plane of the latter, and also being physically separate from one another.

The length of these nanorods depends on the duration of step c). A priori, it is preferred within the context of the invention to produce nanorods not exceeding 1 μm in length so that they retain a certain uprightness, according to the applications mentioned above to which they are more particularly intended, but it is possible, however, to continue their growth for a long enough time to obtain a structure provided with relatively entangled nanorods.

The substrate may be chosen from a wide variety of materials whose deformation temperature is above the temperature at which the substrate has to be heated during step c), such as for example silicon, certain glasses such as borosilicates, quartz or even a metal or metal alloy, such as stainless steel. The substrate may also be solid or perforated, that is to say it maybe, for example, in the form of a grid.

In steps b) and c), this substrate may be heated between other ones by means of a substrate holder provided with heating means, such as for example an electrical resistance heating element.

The subject of the invention is also a process for growing nanorods of a carbide of one metal M1 on a substrate, which consists in subjecting nanocrystals of the metal M1 dispersed within a layer of nanocrystals of at least one metal M2 different from M1, said layer being deposited beforehand on the substrate, to the action of a plasma of at least one hydrocarbon produced by an ECR microwave plasma source.

According to the invention, this growth process is preferably carried out using the same metals M1 and M2 as those mentioned above, an ECR microwave plasma source with high magnetic confinement, of the type described in document [11] and operating conditions similar to those used during step c) of the synthesis process described above. The ECR microwave plasma source may have a magnetic structure consisting of either coils (solenoids), as in document [11], or permanent magnets, as described in FR-A-98/00777 [12].

The processes for the synthesis and growth of metal carbide nanorods on a substrate according to the invention have many advantages. To be specific, apart from the advantages already mentioned, they also offer that of allowing metal carbide nanorods to be produced on substrates of large area, that is to say in practice greater than several $dm^2$, and at costs that are compatible with industrial operation.

The subject of the invention is also a substrate that has metal carbide nanorods attached to its surface, perpendicular to the principal plane of this substrate, and physically separate from one another.

Preferably, these metal carbide nanorods measure 5 to 100 nm in diameter and 100 nm to 1 µm in length.

Also preferably, these metal carbide nanorods are chromium carbide nanorods.

Owing to the remarkable properties that these nanorods have, in terms of strength, robustness, straightness and aspect ratio (length/diameter ratio), the substrates that are provided therewith may be used in very many applications.

In particular, they are suitable for forming part of the construction of microsystems provided with chemical or biological functionalities, more particularly of biosensors, after the said nanorods have been functionalized by the grafting of organic molecules such as, for example, proteins, such as antibodies, antigens or enzymes, or nucleotide fragments (DNA or RNA). Methods for carrying out such grafting are known per se.

The substrates according to the invention are also capable of forming part of the construction of electron emission sources, for example for the fabrication of flat television or computer screens, or of being used to modify the optical properties of surfaces, such as for example luminescence with low wavelength dispersion.

They may also find applications in the production of useful nanofluid devices, for example in chromatography techniques.

Apart from the above provisions, the invention also includes other provisions that will emerge from the rest of the description below, which refers to examples of implementation of the synthesis process according to the invention and examples of metal carbide nanorods obtained by this process.

The rest of the description is given by way of illustrating, but not limiting, the invention and with reference to the appended drawings.

BRIEF DESCRIPTION OF THE DRAWINGS

In FIGS. 1 to 5, the same reference numbers serve to denote the same elements.

EXAMPLES

Figure 1:
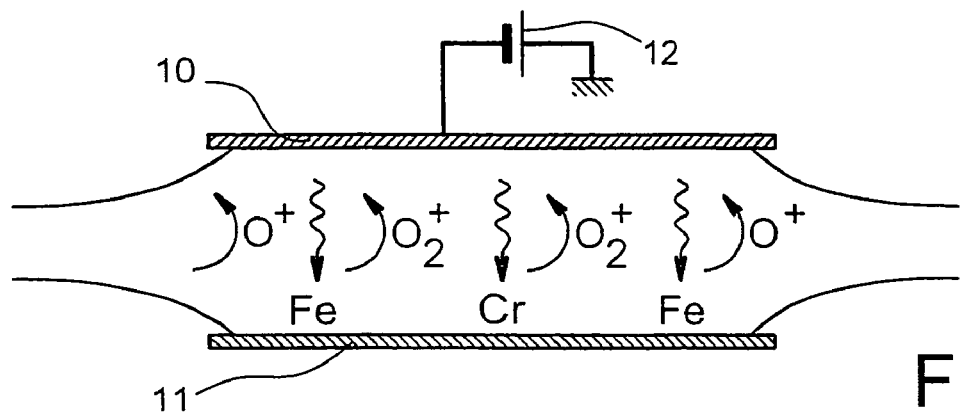
FIGS. 1, 2 and 3 are diagrams illustrating three examples of embodiments of a metal target that can be used in step a) of the synthesis process according to the invention for depositing, on a substrate, a layer comprising 90% iron oxide nanocrystals and 10% chromium oxide nanocrystals, when this step a) is carried out by reactive sputtering of such a target by an oxygen plasma produced by an ECR microwave plasma source.
Figure 2:
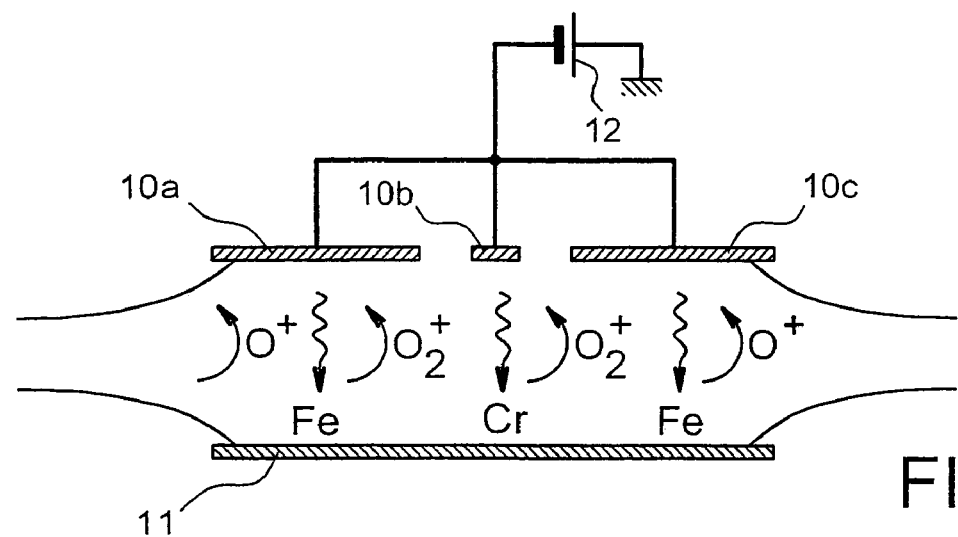
Figure 3:
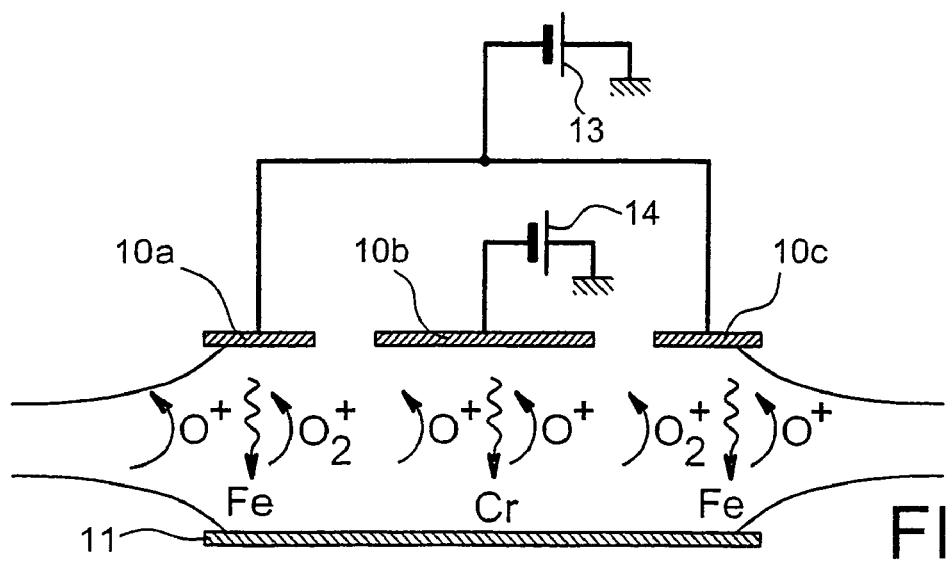

Referring firstly to FIGS. 1, 2 and 3, these show schematically three examples of embodiments of a metal target that can be used in step a) of the synthesis process according to the invention for depositing, on a substrate 11, a layer containing about 90% iron oxide nanocrystals and about 10% chromium oxide nanocrystals, when this step a) is carried out by reactive sputtering of a metal target by an oxygen plasma produced by an ECR microwave plasma source.

These examples are intended to illustrate the possibility afforded by the synthesis process according to the invention for adjusting the fluxes of iron and chromium atoms produced by the target during its sputtering and thereby the density of the chromium oxide nanocrystals in the layer of nanocrystals covering the substrate after step a), by varying the composition of this target and/or its bias.

The metal target shown in FIG. 1 is in the form of a plate 10 that is placed facing the substrate 11, approximately parallel to the latter. This plate is connected to a voltage generator 12 for applying to it one and the same negative bias voltage, for example −400 V, over its entire area.

Since the iron and chromium sputtering rates are substantially identical under the same operating conditions, the target 10 consists of a mixture of iron and chromium, for example a stainless steel, in respective atomic proportions of 90% and 10%.

The metal target shown in FIG. 2 is in the form of three plates, 10a, 10b and 10c respectively, which lie in the same plane facing the substrate 11, but which are slightly separated from one another. These plates are connected to a voltage generator 12 for applying the same negative bias voltage, for example −100 V, to them.

The plates 10a and 10c are made of iron, whereas the plate 10b is made of chromium.

In order for their sputtering to result in the deposition, on the substrate, of a layer containing about 90% iron oxide nanocrystals and about 10% chromium oxide nanocrystals, the sum of the areas of the plates 10a and 10c is approximately equal to nine times that of the plate 10b.

The metal target shown in FIG. 3 is also in the form of three plates, 10a, 10b and 10c respectively, lying in the same plane facing the substrate 11 and slightly separated from one another. As previously, the plates 10a and 10c are made of iron, whereas the plate 10b is made of chromium.

However, this metal target is distinguished from that illustrated in FIG. 2 by the fact that, on the one hand, the sum of the areas of the plates 10a and 10c is equal to the area of the plate 10b and, on the other hand, the plates 10a and 10c and the plate 10b are connected to two different voltage generators, 13 and 14 respectively.

This is because, in this case, the fluxes of iron and chromium atoms produced by the target are adjusted by applying a higher negative bias voltage to the plates 10a and 10c than that applied to the plate 10b, for example −1000 V as opposed to −100 V.

Figure 4:
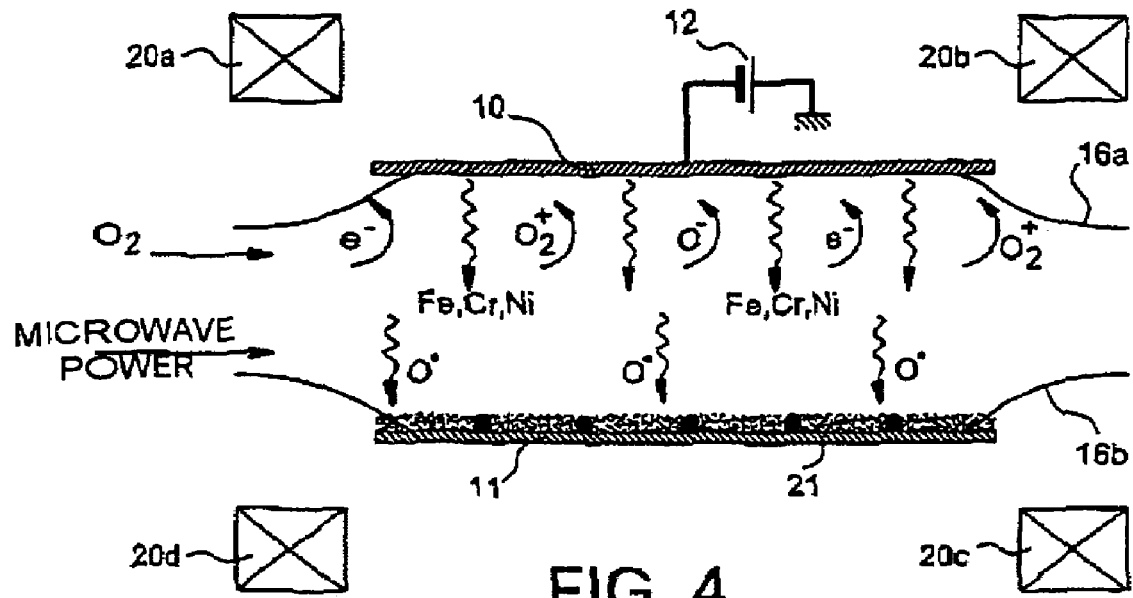
FIG. 4 is a diagram illustrating the reactions that occur during step a) of the synthesis process according to the invention, when this step is carried out by reactive sputtering of a target made of an austenitic stainless steel by an oxygen plasma produced by an ECR microwave plasma source.

Referring now to FIG. 4, this shows schematically the reactions that take place during step a) of the synthesis process according to the invention, when this step is carried out by reactive sputtering of a target 10 made of an austenitic stainless steel, for example composed of 68% iron, 18% chromium and 14% nickel, by an oxygen plasma produced by an ECR microwave plasma source with high magnetic confinement, of the type described in document [11].

Of the components of this source, only the stainless steel target 10, the electrical voltage generator 12 to which it is connected, the substrate 11 on which it is desired to deposit the iron, chromium and nickel oxide nanocrystals, the two external field lines, 16a and 16b respectively, of the magnetic field and the four coils, 20a, 20b, 20c and 20d respectively, that generate this field have been intentionally shown in FIG. 4.

As may be seen in FIG. 4, the oxygen present in the plasma chamber and at a low pressure, for example a few $10^{-4}$ mbar, dissociates owing to the effect of the microwave power injected into this chamber, generating electrons (e$^-$) and ions (O$_2^+$, O$^+$) that sputter the target 10.

This sputtering in turn generates fluxes of iron, chromium and nickel atoms that are deposited on the substrate 11 together with oxygen (O$^-$) atoms, giving rise to the formation of a layer 21 formed from iron oxide (Fe$_2$O$_3$), nickel oxide (NiO) and chromium oxide (Cr$_2$O$_3$) nanocrystals, within which layer the chromium oxide nanocrystals (shown symbolically by solid black circles in FIG. 4) are dispersed.

Figure 5:
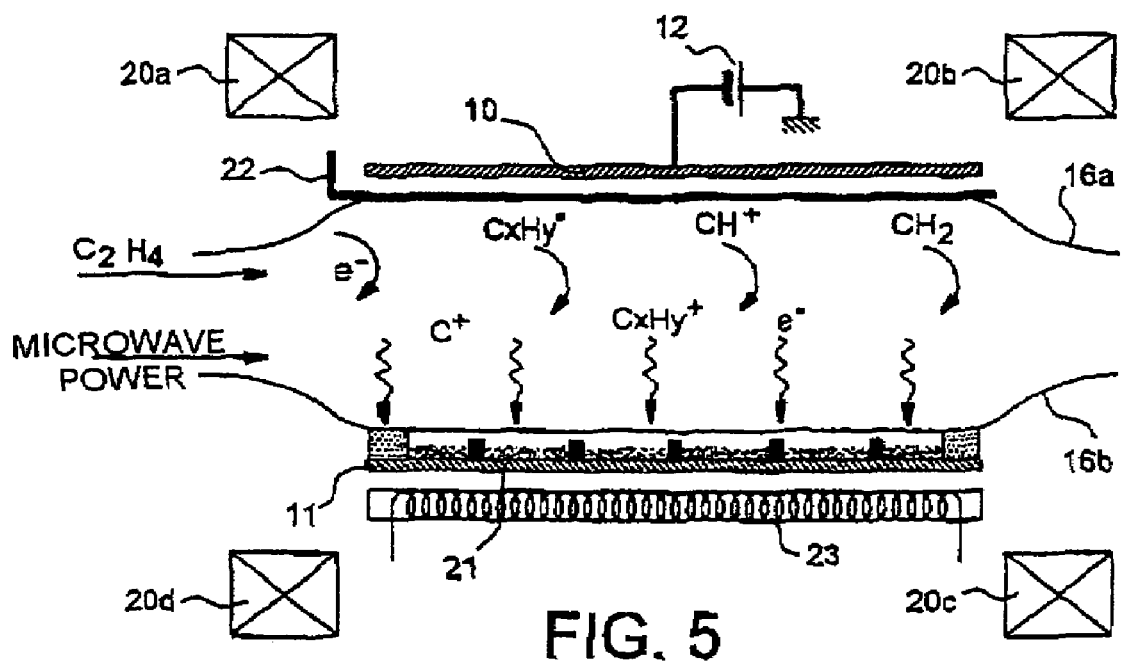
FIG. 5 is a diagram illustrating the reactions that occur during step c) of the synthesis process according to the invention, when this step is carried out by an ethylene plasma produced by an ECR microwave plasma source.

FIG. 5 is a schematic representation similar to that of FIG. 4, but which shows the reactions that take place during step c) of the synthesis process according to the invention, when this step is carried out by an ethylene plasma produced by an ECR microwave plasma source, with high magnetic confinement.

Shown in FIG. 5 are two elements that are absent from FIG. 4, as they are unnecessary during step a), namely a removable shield 22 for the target 10 and a substrate holder 23 provided with heating means, for example an electrical resistance heating element.

In what follows, the layer 21 of nanocrystals covering the substrate 11 is considered to be formed from iron, chromium and nickel nanocrystals and results from the reduction of a layer of iron, chromium and nickel oxide nanocrystals that is obtained as illustrated in FIG. 4.

The ethylene present in the plasma chamber and which is at a low pressure, for example a few $10^{-3}$ mbar, dissociates owing to the effect of the microwave power injected into this chamber, generating electrons (e$^-$) and reactive carbon species (C$_x$H$_y^+$ and C$_x$H$_y$, where x=1 or 2 and y=0 to 4).

These reactive species, on the one hand, react with the chromium present in the chromium nanocrystals on the surface of the substrate 11 in order to form with it chromium carbide thus leading to the growth, from these nanocrystals, of chromium carbide nanorods (shown symbolically by solid black rectangles in FIG. 5) and, on the other hand, are fixed by the iron and nickel nanocrystals, which causes the formation of a protective graphitic layer that prevents any growth from the iron and nickel nanocrystals.

The examples that follow are intended to illustrate modes of implementing the process according to the invention.

Example 1

Synthesis of Chromium Carbide Nanorods on Silicon

Chromium carbide nanorods were synthesized on silicon substrates using, for the three steps a), b) and c), an ECR microwave plasma source with high magnetic confinement, similar to that described in document [11].

The operating conditions were the following:

step a): sputtering of a metal target by an oxygen plasma:
  target used: austenitic stainless steel composed of 68% Fe, 18% Cr and 14% Ni
  target bias: −400 V
  oxygen pressure: $2\times10^{-4}$ mbar
  sputtering time: 20 minutes
  thickness of the nanocrystal layer thus deposited: ≈50 nm;
step b): reduction by a hydrogen plasma:
  hydrogen pressure: $1.5\times10^{-3}$ mbar
  substrate temperature: 500° C.
  reduction time: 10-20 minutes;
step c): growth by an ethylene plasma:
  microwave power: 50-150 watts for a frequency of 2.45 GHz
  ethylene pressure: $10^{-3}$–$3\times10^{-3}$ mbar
  substrate temperature: 640° C.
  growth time: 10-30 minutes.

Figure 6:
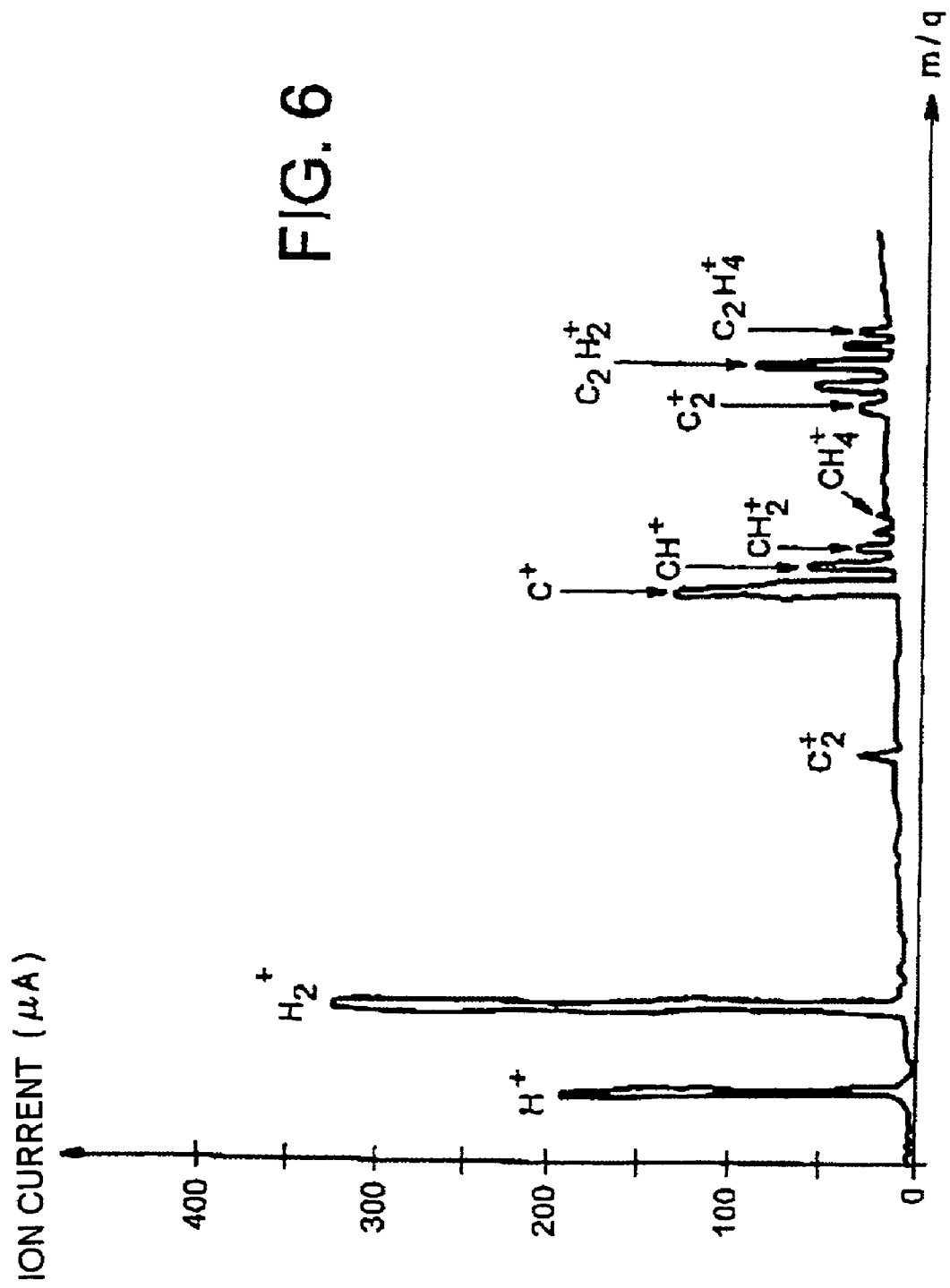
FIG. 6 shows the mass spectrum of the dissociation of ethylene by electron impacts, as obtained during step c) of the synthesis process according to the invention, when this step is carried out by an ethylene plasma produced by an ECR microwave plasma source.

FIG. 6 shows the mass spectrum for the dissociation of ethylene C$_2$H$_4$ by electron impacts, as obtained under these operating conditions. This spectrum shows that the ethylene is strongly dissociated into atoms and ions, namely H$^+$, H$_2^+$, C$^+$, C$^{2+}$, CH$^+$, CH$_2^+$, etc, these being fragments of this dissociation.

Figure 7:
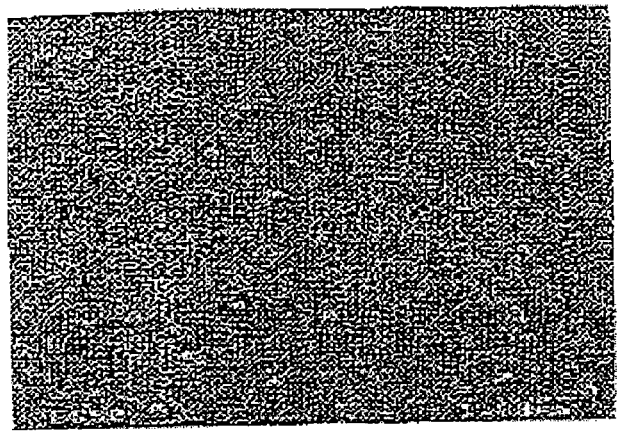
FIG. 7 is an SEM (scanning electron microscope) micrograph, at 30 000× magnification, showing the onset of chromium carbide nanorod growth on a silicon wafer, as observed during implementation of the synthesis process according to the invention.
Figure 8:
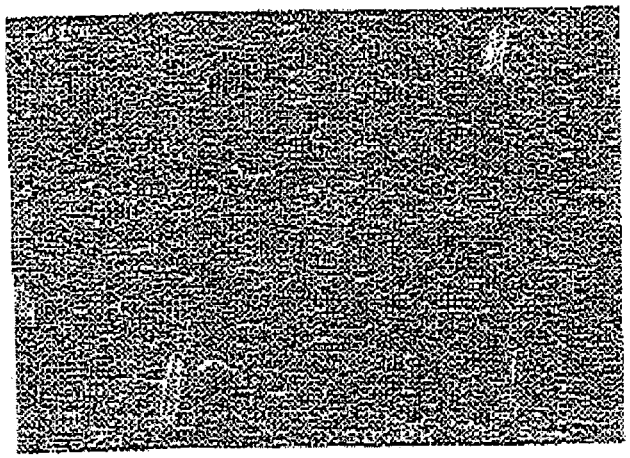
FIG. 8 is an SEM micrograph, at 80 000× magnification, of chromium carbide nanorods synthesized on a silicon wafer by the synthesis process according to the invention.
Figure 9:
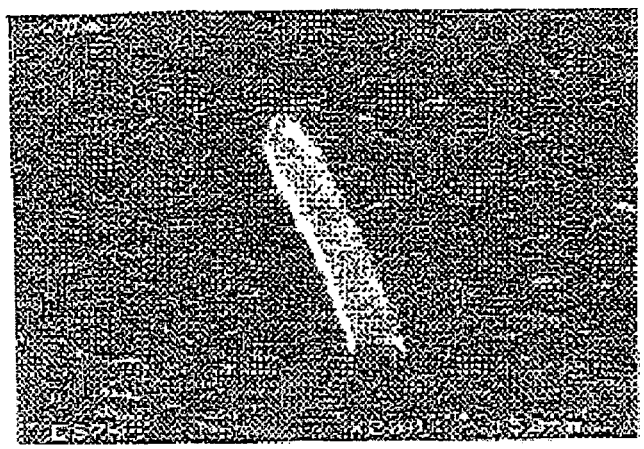
FIG. 9 is an SEM micrograph, at 200 000× magnification, of a chromium carbide nanorod synthesized on a silicon wafer by the synthesis process according to the invention.

Moreover, FIGS. 7 to 9 are SEM micrographs, at 30 000×, 80 000× and 200 000× magnifications respectively, which show, in the first micrograph, the onset of growth of the chromium carbide nanorods on the substrate and, in the case of the other two micrographs, chromium carbide nanorods as obtained at the end of step c).

As may be seen in FIGS. 8 and 9, these nanorods (Ø≈37 nm, L≈190 nm for the nanorods shown in FIG. 8; Ø≈50 nm, L≈250 nm for the nanorod shown in FIG. 9) are fixed to the substrate perpendicular to its principal plane, are straight and, in addition, are physically separate from one another, in the present case by a distance of about 800 nm (FIG. 8).

Example 2
Synthesis of Chromium Carbide Nanorods on a Stainless Steel Grid Chromium carbide nanorods were synthesized on a substrate consisting of a stainless steel grid, also using, for the three steps a), b) and c), an ECR microwave plasma source with high magnetic confinement, similar to that described in document [11].

The operating conditions were the following:

step a): sputtering of a metal target by an oxygen plasma:
- target used: austenitic stainless steel composed of 68% Fe, 18% Cr and 14% Ni
- target bias: −400 V
- oxygen pressure: $2\times10^{-4}$ mbar
- sputtering time: 20 minutes
- thickness of the nanocrystal layer thus deposited: ≈50 nm;

step b): reduction by a hydrogen plasma:
- hydrogen pressure: $3\times10^{-3}$ mbar
- substrate temperature: 550° C.
- reduction time: 10 minutes;

step c): growth by an ethylene plasma:
- microwave power: 50 watts for a frequency of 2.45 GHz
- ethylene pressure: $3\times10^{-3}$ mbar
- substrate temperature: 620° C.
- growth time: 16 minutes.

Figure 10:
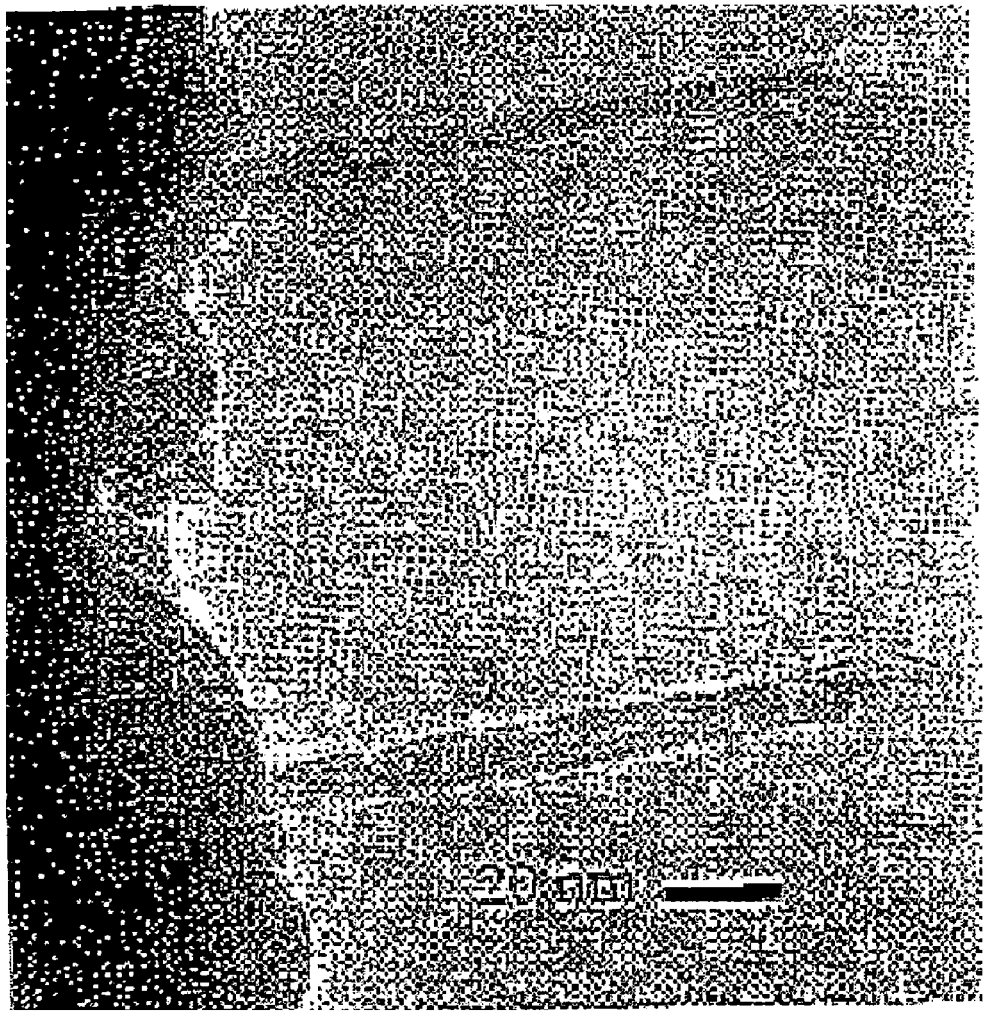
FIG. 10 is a TEM (transmission electron microscope) micrograph, at 300 000× magnification, of chromium carbide nanorods synthesized on a stainless steel grid by the synthesis process according to the invention.

Thus, the chromium carbide nanorods visible in FIG. 10, which corresponds to a TEM micrograph at 300 000× magnification, were obtained.

Here again, these nanorods, which measure about 10 nm in diameter and a little more than about 100 nm in length, are fixed to the substrate perpendicular to its principal plane, are straight and are also physically separate from one another, in this case separated by a distance of slightly greater than 100 nm.

Figure 11:
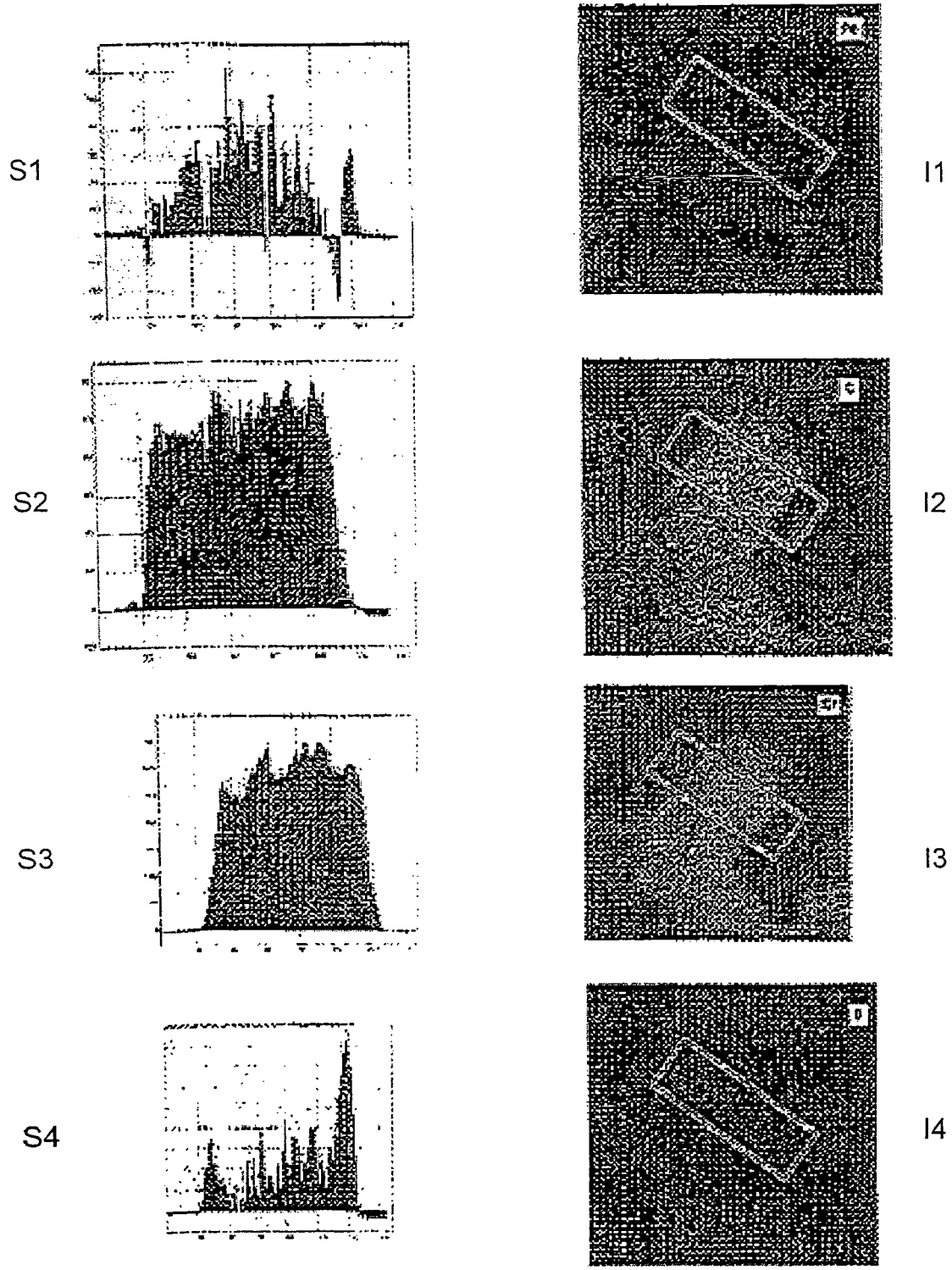
FIG. 11 shows the spectra obtained by energy loss spectroscopy (spectra S1, S2, S3 and S4) and the TEM images (images I1, I2, I3 and I4) for the iron, carbon, chromium and oxygen atoms present in chromium carbide nanorods synthesized by the synthesis process according to the invention, the spectrum S1 and the image I1 corresponding to iron, the spectrum S2 and the image I2 corresponding to carbon, the spectrum s3 and the image I3 corresponding to chromium and the spectrum S4 and the image I4 corresponding to oxygen.

FIG. 11 shows the spectra obtained by energy loss spectroscopy (spectra S1, S2, S3 and S4) and the transmission electron microscope images (images I1, I2, I3 and I4) for the iron, carbon, chromium and oxygen atoms present in these nanorods, the spectrum S1 and the image I1 corresponding to iron, the spectrum S2 and the image I2 corresponding to carbon, the spectrum S3 and the image I3 corresponding to chromium and the spectrum S4 and the image I4 corresponding to oxygen.

These spectra and these images confirm that the nanorods synthesized according to the invention do indeed mainly consist of chromium carbide, iron and oxygen both being present only in residual form.

TABLE 1

| Ref. | Material | Synthesis process | Problems |
|---|---|---|---|
| [1] | C nanotubes $\phi \approx 0.5-5$ nm | $Mg_{0.9}Co_{0.1}O$ solid solution reduction by $H_2/CH_4$: $\theta = 1000°$ C. | no attachment to a substrate high temperature |
| [2] | $WS_2$ nanotubes $\phi \approx 30$ nm | $WO_x$ nanorods or nanoneedle reduction by $H_2S$: $\theta = 1100°$ C. | no attachment to a substrate high temperature |
| [3] | C nanotubes on Si $\phi \approx 30$ nm-12 μm | MPECVD on Co layer: f = 2.45 GHz; P = 5 kW; $\theta = 825°$ C.; p = 20 torr; gas = $C_2H_2/NH_3$ | touching tubes |
| [4] | C nanotubes on quartz $\phi \approx 80-150$ nm | CVD on Ni film: gas = ethylene diamine/$N_2$ | touching tubes |
| [5] | Si nanostructures on Si | optical lithography by $Ar^+$ laser (λ = 458 nm) $O_2$ plasma etching, then $SF_6$ plasma etching | lithography: cost/area |
| [6] | C nanotubes on Si $\phi \approx 150$ nm | electron beam lithography + evaporation → Ni grid PEHFCVD: $\theta = 660°$ C.; p = 1; 10 torr; gas = $C_2H_2/NH_3$ | lithography: cost/area irregular dispersion |
| [7] | C nanotubes on Si $\phi \approx 100$ nm | optical lithography + electron beam lithography → Ni pads DCCVD: 2 mm Cu anode; −600 V; $\theta =700°$ C.; p = $10^2$ torr; gas = $C_2H_2/NH_3$ | lithography: cost/area difficult implementation |
| [8] | Bundles of C nanotubes on Si | electron beam lithography + evaporation → perforated Fe film CVD: $\theta = 700°$ C.; gas = $C_2H_4$ | lithography: cost/area nanotubes joined into bundles |
| [9] | C nanotubes on Si | cathodic sputtering or thermal evaporation → Ni or Co film sintering: $\theta = 750°$ C.; DCCVD: 2 mm Cu anode: −600 V; $\theta = 700°$ C.; gas = $C_2H_2/NH_3$ | insufficient distance between nanotubes difficult implementation |
| [10] | C nanotubes on multi-hole alumina | Co electrochemical deposition $C_2H_2$ pyrolysis: $\theta = 650°$ C. | insufficient distance between nanotubes |

BIBLIOGRAPHY

[1] E. Flahaut, A. Peigney, Ch. Laurent and A. Rousset, *J. Mater. Chem.*, 2000, 10, 249-252.

[2] Y. Q. Zhu, W. K. Hsu, H. Terrones, N. Grobert, B. H. Chang, M. Terrones, B. Q. Wei, H. W. Kroto, D. R. M. Walton, C. B. Boothroyd, I. Kinloch, G. Z. Chen, A. H. Windle and D. J. Fray, *J. Mater. Chem.*, 2000, 10, 2570-2577.

[3] C. Bower, W. Zhu, S. Jin and O. Zhou, *Appl. Phys. Lett.*, 2000, 77(6), 830-832.

[4] W. D. Zhang, Y. Wen, W. C. Tjiu, G. Q. Xu and L. M. Gan, *Appl. Phys. A*, 2002, 74, 419-422.

[5] K. Hadobas, S. Kirsch, A. Carl, M. Acet and E. F. Wassermann, *Nanotechnology*, 2000, 11, 161-164.

[6] Z. F. Ren, Z. P. Huang, D. Z. Wang, J. G. Wen, J. W. Xu, J. H. Wang, L. E. Calvet, J. Chen, J. F. Klemic and M. A. Reed, *Appl. Phys. Lett.*, 1999, 75(8), 1086-1088.

[7] K. B. K. Teo, M. Chhowalla, G. A. J. Amaratunga, W. I. Milne, D. G. Hasko, G. Pirio, P. Legagneux, F. Wyczisk and D. Pribat, *Appl. Phys. Lett.*, 2001, 79(10), 1534-1536.

[8] S. Fan, W. Liang, H. Dang, N. Franklin, T. Tombler, M. Chapline and H. Dai, *Physica E*, 2000, 8, 179-183.

[9] M. Chhowalla, K. B. K. Teo, C. Ducati, N. L. Rupesinghe, G. A. J. Amaratunga, A. C. Ferrari, D. Roy, J. Robertson and W. I. Milne, *J. Appl. Phys.*, 2001, 90(10), 5308-5317.

[10] J. Li, C. Papadopoulos, J. M. Xu and M. Moskovits, *Appl. Phys. Lett.*, 1999, 75(3), 367-369.

[11] M. Delaunay and E. Touchais, *Rev. Sci. Instrum.*, 1998, 69(6), 2320-2324.

[12] FR-A-98/00777.

The invention claimed is:

1. A process for synthesizing nanorods of a carbide of one metal M1 on a substrate, comprising the following steps:
   a) the deposition, on the substrate, of a layer comprising nanocrystals of oxide of the metal M1 and nanocrystals of oxide of at least one metal M2 different from the metal M1, the M1 metal oxide nanocrystals being dispersed within this layer;
   b) the reduction of the M1 and M2 metal oxide nanocrystals into corresponding metal nanocrystals; and
   c) the selective growth of the M1 metal nanocrystals.

2. The process according to claim 1, wherein step a) is carried out by reactive sputtering from a target consisting of the metals M1 and M2 by an oxygen plasma produced by an electron cyclotron resonance microwave plasma source.

3. The process according to claim 2, wherein said target comprises a mixture of the metals M1 and M2.

4. The process according to claim 2, wherein said target comprises several zones, adjacent to one another or separated from one another, at least one of these zones consisting of the metal M1, whereas the one or more other of these zones consist(s) of the metal or metals M2.

5. The process according to claim 1, wherein step b) is carried out by a hydrogen plasma produced by an electron cyclotron resonance microwave plasma source, the substrate being heated.

6. The process according to claim 1, wherein step c) is carried out by a plasma of at least one hydrocarbon produced by an electron cyclotron resonance microwave plasma source, the substrate being heated.

7. The process according to claim 1, wherein the metal M1 is selected from the group consisting of metals capable of reacting with organic molecules or radicals that are in gaseous form in order to form, with them, a metal carbide.

8. The process according to claim 7, wherein the metal M1 is at least one selected from the group consisting of chromium and molybdenum.

9. The process according to claim 1, wherein the metal or metals M2 are selected from the group consisting of metals utilized as catalysts in organic chemistry.

10. The process according to claim 9, wherein the metal or metals M2 are at least one selected from the group consisting of iron, nickel and cobalt.

11. The process according to claim 2, wherein said target comprises a stainless steel composed of iron and chromium, or of iron, chromium and nickel.

12. The process according to claim 10, wherein said target is biased with a negative voltage of −200 V or higher and preferably of between −400 and −200 V.

13. The process according to claim 11, wherein said oxygen plasma is maintained at a pressure of generally $10^{-3}$ mbar or below, and preferably between $10^{-4}$ and $10^{-3}$ mbar.

14. The process according to claim 5, wherein, in step b), the hydrogen plasma is maintained at a pressure of $10^{-2}$ mbar or below, and advantageously between $10^{-3}$ and $10^{-2}$ mbar, and the substrate is heated to a temperature ranging from 300 to 600° C.

15. The process according to claim 6, wherein, in step c), the hydrocarbon plasma is maintained at a pressure of $10^{-2}$ mbar or below, and preferably between $10^{-3}$ and $10^{-2}$ mbar, while the substrate is heated to a temperature of 600° C. or higher, and preferably between 600 and 800° C.

16. The process according to claim 6, wherein the hydrocarbon or hydrocarbons used in step c) are at least one selected from the group consisting of alkanes, alkenes, alkynes, and ethylene.

17. The process according to claim 1, wherein the substrate is at least one selected from the group consisting of silicon, borosilicate glasses, quartz, metals and metal alloys.

18. A process for growing nanorods of a carbide of one metal M1 on a substrate, which consists in subjecting nanocrystals of the metal M1 dispersed within a layer of nanocrystals of at least one metal M2 different from M1, said layer being deposited beforehand on the substrate, to the action of a plasma of at least one hydrocarbon produced by an ECR microwave plasma source.

19. The process according to claim 18, wherein the metal M1 is selected from the group consisting of metals capable of reacting with organic molecules or radicals that are in gaseous form in order to form, with them, a metal carbide.

20. The process according to claim 19, wherein the metal M1 is at least one selected from the group consisting of chromium and molybdenum.

21. The process according to claim 18, wherein the metal or metals M2 are selected from the group consisting of metals utilized as catalysts in organic chemistry.

22. The process according to claim 21, wherein the metal or metals M2 are at least one selected from the group consisting of iron, nickel and cobalt.

23. The process according to claim 18, wherein the hydrocarbon plasma is maintained at a pressure of $10^{-2}$ mbar or below and preferably of between $10^{-3}$ and $10^{-2}$ mbar, while the substrate is heated to a temperature of 600° C. or higher, and preferably of between 600 and 800°.

24. The process according to claim 18, wherein the hydrocarbon or hydrocarbons are at least one selected from the group consisting of alkanes, alkenes, alkynes, and ethylene.

25. The process according to claim 18, wherein the substrate is at least one selected from the group consisting of silicon, borosilicate glasses, quartz, metals and metal alloys.

* * * * *